United States Patent [19]

Dearnaley et al.

[11] 4,105,443
[45] Aug. 8, 1978

[54] METAL-FORMING DIES

[75] Inventors: Geoffrey Dearnaley, Abingdon; Nicholas Edmund Whittam Hartley, Chilton, both of England

[73] Assignee: United Kingdom Atomic Energy Authority, England

[21] Appl. No.: 762,252

[22] Filed: Jan. 25, 1977

[30] Foreign Application Priority Data

Jan. 28, 1976 [GB] United Kingdom ............... 3421/76

[51] Int. Cl.² .............................................. B05D 3/06
[52] U.S. Cl. ...................................... 75/238; 30/345; 76/107 R; 148/4; 148/39; 148/126; 250/492 B; 427/38; 427/249; 75/237
[58] Field of Search ............. 427/38, 249; 250/492 B; 76/107 R, DIG. 11; 30/345, 350; 29/34 A, 34 B, 34 C, 34 D, 400 M; 148/4, 39, 126; 75/236, 237, 238

[56] References Cited

U.S. PATENT DOCUMENTS

| 3,811,961 | 5/1974 | Weinstein et al. | 75/237 |
| 3,832,219 | 8/1974 | Nelson et al. | 427/38 |
| 3,836,392 | 9/1974 | Lux et al. | 30/350 |
| 3,914,473 | 10/1975 | Hale | 30/345 |
| 3,955,038 | 5/1976 | Lindstrom et al. | 427/249 |
| 3,988,955 | 11/1976 | Engel et al. | 427/38 |

Primary Examiner—John H. Newsome
Attorney, Agent, or Firm—Larson, Taylor and Hinds

[57] ABSTRACT

A method is provided for treating a metal working tool element made of cemented carbide materials, as hereinafter described, comprising the operation of implanting into a working surface of the tool element ions of a material such as to modify the implanted region of the working surface of the tool element in such a way as to prevent adhesion between the matrix metal of the cemented carbide tool element and a metal being worked by the tool element. Metal working tool elements so treated are also disclosed.

19 Claims, 8 Drawing Figures

METAL-FORMING DIES

The present invention relates to metal-working tools made of cemented carbides, and more specifically to dies made of such materials. In particular, the invention relates to metal forming dies made of tungsten carbide.

Cemented carbide tools are made by sintering, at high temperature and pressure in an atmosphere of hydrogen, a mixture of carbides of one or more refractory metals, such as tungsten, tantalum, molybdenum or titanium and a powdered matrix material containing cobalt, either alone or with other metals such as chromium. In each case, incipient fusion of the cobalt occurs and it forms a ductile bond between the carbide particles.

Tungsten carbide dies used in processes involving the working of iron-containing metals have shown a type of damage which suggests that the iron in the metals adheres to the cobalt matrix of the tungsten carbide, with subsequent failure of the die surface due to galling. A similar mechanism is believed to occur in connection with dies made of the material known as "Stellite", which is a non-ferrous material containing tungsten and chromium carbides in a matrix of cobalt and chromium.

A typical process involving the working of ferrous metals in which the above problem arises is the manufacture of hollow metal bodies for cans or other containers from a flat blank of thin sheet metal. The blank is deep-drawn by a punch through at least one annular die. The process typically consists of more than one stage, depending on the length of the final body. For example, the flat blank may first be drawn into the form of a cup, the sidewall of the cup being subsequently elongated. This elongation is effected by forcing the cup, carried by a punch, through one or more further annular dies until a required length of sidewall is achieved. These dies may be of such dimensions that the elongation is obtained wholly, or mainly by decreasing the thickness of the wall without any significant flow of metal from the base of the cup into the sidewall (wall ironing). Alternatively one or more of the dies may be such that the sidewall is elongated principally by drawing metal from the base of the cup, with or without some measure of wall-ironing taking place simultaneously.

Another common method of making a hollow metal body such as a container is by the extrusion of a flat metal blank through an annular die, the blank being forced through the die by a punch.

When the dies and punches used include working surfaces made of cemented carbides, then the type of damage referred to occurs.

According to the present invention there is provided a method of treating a metal working tool element made of cemented carbide materials, as hereinbefore described, comprising the operation of implanting into working surfaces of the tool elementions of a material such as to modify the surfaces of the tool element in such a way as to prevent interaction between the matrix metal of the cemented carbide tool element and a metal being worked by the tool element.

According to the invention in one aspect there is provided a method of treating metal working dies made of cemented tungsten carbide comprising the operation of implanting into working surfaces of the dies ions of a material such as to modify the working surfaces of the dies in such a way as to prevent interaction between the matrix metal of the cemented tungsten carbide and a metal being formed by the die.

Also according to the invention there is provided a cemented carbide, as hereinbefore defined, metal-working tool element having a working surface into which has been implanted ions of a material such as to modify the working surface in such a way as to prevent interaction between the matrix metal of the cemented carbide tool element and a metal being worked by the tool element.

A particular form of cemented carbide tool element is a die made of cemented tungsten carbide.

These dies may be for use in conjunction with punches for forcing the metal into or through the dies. The punches may be made of steel and/or cemented carbides, in which case they too can be treated in the same way as the dies.

Other forms of tool element are:

Cemented carbide dies made of the material known as "Stellite", such as wire drawing dies.

Seaming tools comprising seaming rolls which in two operations form the double seam securing a can end to a can body, together with a seaming chuck which engages the can end centrally during the seaming operation.

Punches for forming metal end closure members for containers.

Also according to the invention in another aspect there is provided a method of manufacturing a succession of metal articles using at least one cemented carbide tool element, as hereinbefore defined, a working surface of which has been implanted with ions of a material such as to modify the working surface of the tool element in such a way as to prevent interaction between the matrix material of the cemented carbide tool element and the metal from which the articles are made.

In one process according to the invention the ions which are implanted are such as to react with the cobalt in the matrix of a cemented carbide to produce non-metallic compounds thereof, for example, carbon ions may be implanted to form cobalt carbide, or $CO^+$ ions may be implanted to form cobalt carbide, or $CO^+$ ions may be implanted both to provide carbon to form cobalt carbide, and also oxygen to form cobalt oxide.

The formation of cobalt carbide or cobalt oxide reduces the possibility of welding occuring between the cobalt and metal being worked by the tool element. Also, it is thought that the implanted ions migrate to the interfaces between the cobalt and the grains of carbides and improve the bonding thereof.

Implanted carbon ions, in particular, create tungsten vacancies which are then populated with carbon in a hard diamond-like structure.

Other ion species which may be used include $B^+$, $N^+$, $O^+$, $Cl^+$, $He^+$, $Br^+$, $Be^+$, $Ne^+$, or $A^+$.

In another process according to the invention, ions which form soft oxides are implanted into working surfaces or surfaces of a tool element such as a die and/or a punch for forcing a metal through the die. The oxygen required to form the oxides may either be already present, or implanted at the same time. Suitable ion species are $Fe^+$, $Cu^+$, $Zn^+$, $Mo^+$, $Ag^+$, $Cd^+$, $In^+$, $Sn^+$ and $Pb^+$. It is to be noted that some of the elements are soft enough to form solid lubricants themselves.

In a third process according to the invention, the implanted ions are such as to enhance the attachment of lubricant molecules to the working surfaces of the tool element so as to encourage boundary lubrication thereby to prevent metal-to-metal contact between the cobalt contained in the die and the metal being formed. Suitable ion species are those of elements of high valence, those of elements which form stable sulphides and those of the alkali metals. For example, those of Li; Na; Mg; K; Ca; Ti; V; Mo; W; or Bi.

In general, the ions should be such that they are capable of forming hard compounds with the material into which they are implanted; they have one or more of the following properties; they should have a valency greater than three so that they are capable of forming strongly-bonded networks of compounds with the implanted species; and they should be as light as practicable to facilitate their generation and implantation.

The invention will now be further explained and described by way of example with reference to the accompanying drawings in which.

Figure 1:
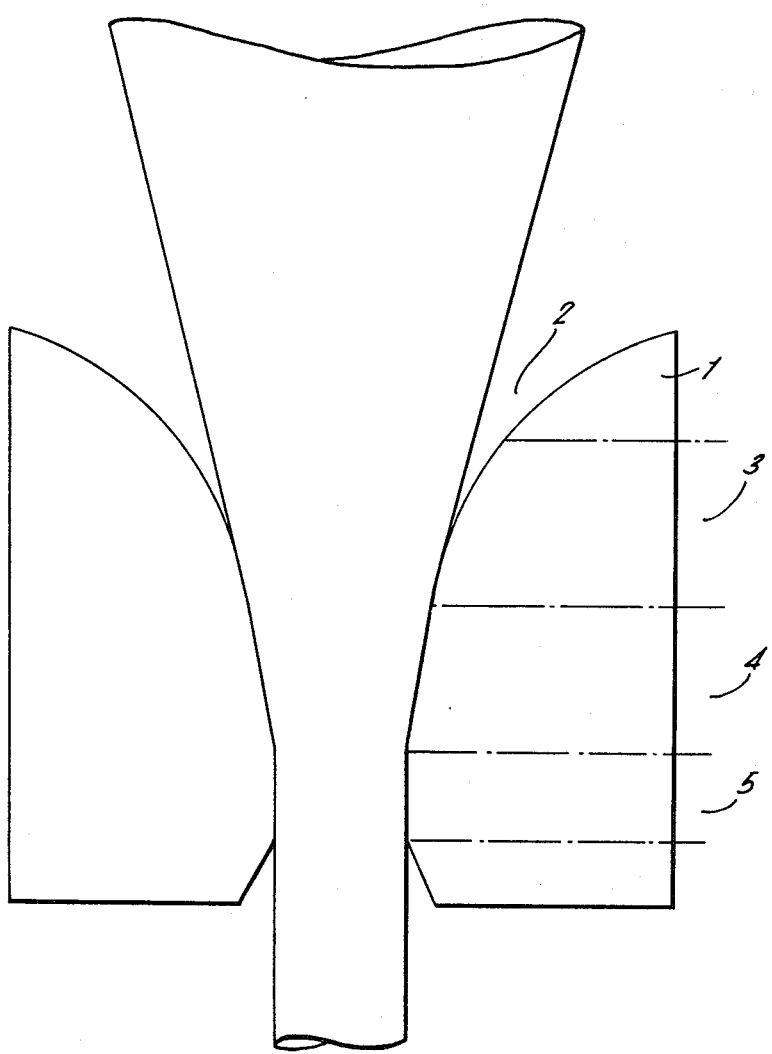
FIG. 1 is a cross-section of a wire-drawing die embodying the invention.

Referring to FIG. 1, a typical cemented carbide drawing die consists of a cylindrical body 1 of cemented carbide with a central hole 2. The central hole 2 has a convergent portion 3 known as the reducing sector, a cylindrical portion 5 known as the bearing length, and a frusto-conical portion 4.

Another cemented carbide material which is used to make wire-drawing dies is that known as "Stellite".

In practice, a series of such dies are used, the last one having a bearing portion with a diameter equal to that of a wire to be produced, and a billet of metal to be turned into wire is drawn sequentially through the dies.

The central holes 2 of six such dies made of cemented tungsten carbide were separately implanted with doses of ions of helium, nitrogen and carbon. Three dies were implanted with ion doses of approximately $1 \times 10^{17}$ ions/cm$^2$ and three were implanted with ion doses of approximately $5 \times 10^{17}$ ions/cm$^2$. Tests were then carried out as follows:

Stage 1. Three dies implanted with dosages of ions of $10^{17}$ ions/cm$^2$ were used to draw 3 tonnes of copper rod the same production batch.

Stage 2. Three dies implanted with dosages of ions of $5 \times 10^{17}$ ions/cm$^2$ were used to each draw 3 tonnes of copper rod from the same production batch and the results compared with a conventional die.

Stage 3. The dies used in Stage 2 were again used to draw 3 tonnes of rod using a new set of back-up dies.

Stage 4. The same dies were then used until the wire diameter (nominally 0.112 inches) was outside the normal working tolerance. As in Stage 3, a new set of back-up dies was used.

For all stages of the experiment, the drawing speed was 1930 feet per minute at a temperature of 37°C.

Figure 2:
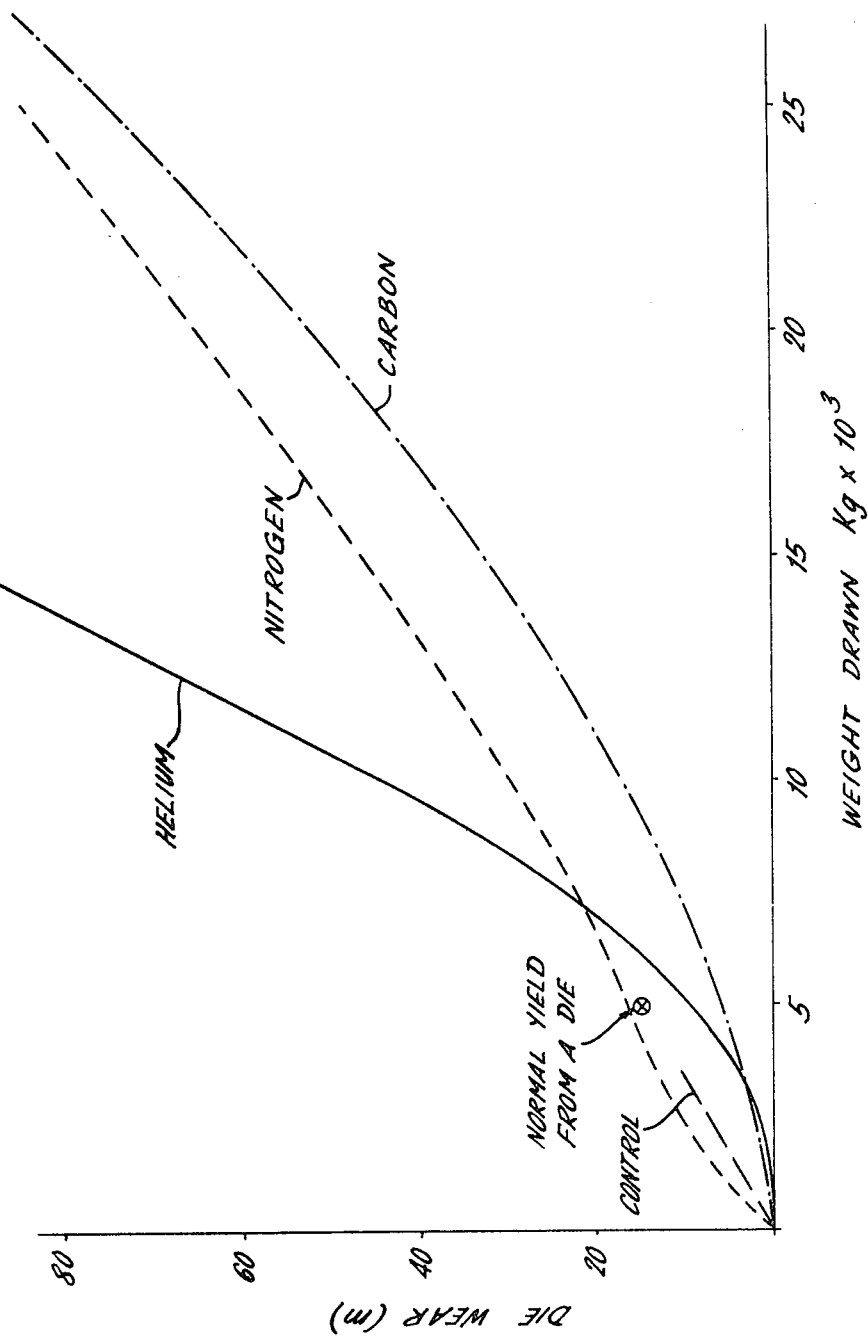
FIG. 2 is a graph showing the variations in performance of a wire drawing die with different species of implanted ions.

The results of the tests are summarised in the following table, and are illustrated graphically in FIG. 2.

| Stage | Ionic Species | Ionic dose | Finishing Die Wear | Back-up Die Wear | Tonnage Drawn |
|---|---|---|---|---|---|
| 1 | Helium | $10^{17}$ | 0.58 | 0.77 | 3.4 |
|   | Nitrogen | " | 0.40 | 0.78 | 3.5 |
|   | Carbon | " | 0.52 | 0.81 | 3.3 |
| 2 | Helium | $5 \times 10^{17}$ | 0.05 | 0.22 | 3.3 |
|   | Nitrogen | " | 0.14 | 0.22 | 3.3 |
|   | Carbon | " | 0.05 | 0.26 | 3.3 |
|   | Conventional | " | 0.17 | 0.26 | 3.3 |
| 3 | Helium | $5 \times 10^{17}$ | 0.24 | 0.35 | 3.2 |
|   | Nitrogen | " | 0.19 | 0.30 | 3.2 |
|   | Carbon | " | 0.09 | 0.17 | 3.2 |
| 4 | Helium | $5 \times 10^{17}$ | 0.34 | 0.43 | 8.6 |
|   | Nitrogen | " | 0.17 | 0.40 | 17.6 |
|   | Carbon | " | 0.16 | 0.35 | 20.6 |

It can be seen from the graph that although only three tonnes of wire were drawn through the control die, experience has shown that the normal yield from a conventional die under the same conditions is about 5 tonnes before the produced wire becomes outside the normal working tolerance. It can be seen, particularly from FIG. 2, that the yield of dies implanted with an ion dose of $5 \times 10^{17}$ ions/cm$^2$ is greatly increased.

The first stage of the experiment suggests that an ion dose of only $1 \times 10^{17}$ ions/cm$^2$ does not significantly decrease die wear, although the back-up die wear was higher than that experienced in stages 2–4, which may indicate some difference between the feedstock used in stage 1 and that for stages 2–4.

Figure 3:
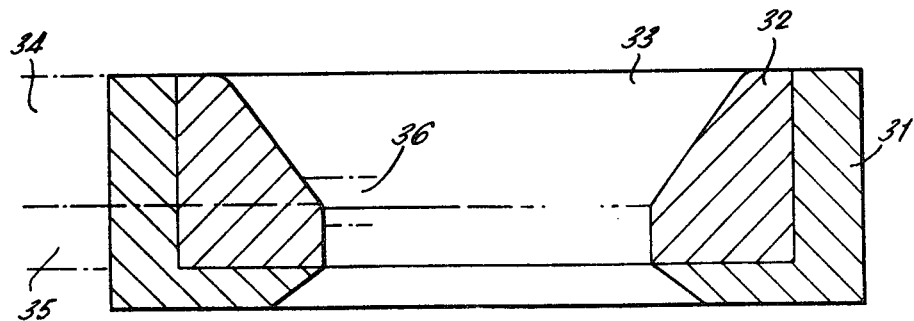
FIG. 3 is a cross-section of a die ring embodying the invention.

Referring to FIG. 3 of the drawings, a die ring for use in the process of making thin metal cans, to form a succession of cylindrical can bodies consists of a steel ring 31 approximately 6 inches diameter by 1 inches thickness with a cemented tungsten carbide insert 32.

The insert 32 has a central hole 33 having a frusto-conical portion 34 and a cylindrical portion 35 the diameter of which is that of the can body workpiece upon the latter leaving the die ring. The inner surface of the hole 33 is accurately machined and finished.

A circumferential strip 36 some 1/2 inch wide and symmetrically disposed about the junction between the frusto-conical and cylindrical portions 34 and 35, respectively, of the hole 33 is implanted with CO$^+$ ions at an energy of 400 Kev to a total dose of $10^{17}$ ions/cm$^2$.

In practice, for the manufacture of can bodies, a metal blank is forced through the die ring, which is mounted in a suitable holder, by a reciprocating punch. Generally a plurality of such die rings is used in a series arrangement and there is a difference of about 0.003 inch in diameter between successive die rings. The punch may be made entirely of steel or it may have a cemented carbide ring attached to it, in which case the cemented carbide ring may also be subjected to an ion implantation treatment similar to that used for the die ring.

Under arduous conditions using plain mild steel instead of tinplate, a set of implanted die rings successfully produced ten can bodies before failure occurred, whereas identical but untreated dies failed to produce any can bodies.

Figure 4:
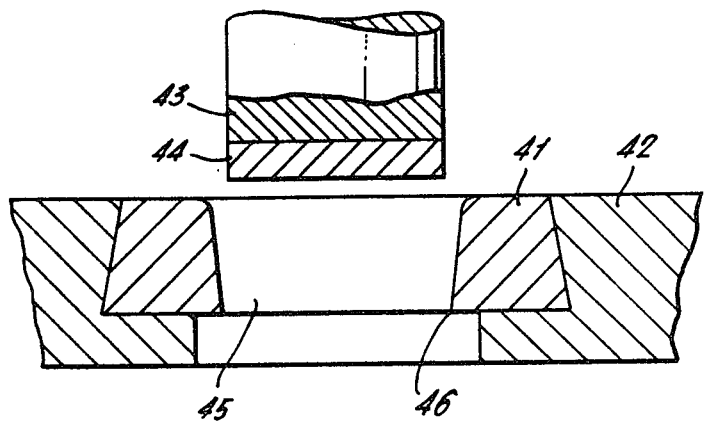
FIG. 4 is a cross-section of an extrusion die and punch embodying the invention.

FIG. 4 shows an extrusion die insert 41 made of a cemented carbide held in a mounting 42. An associated punch 43 has a cemented carbide end cap 44 attached to its operational end. The insert 41 has a tapering cenral hole 45 with its smaller diameter being that of the body to be formed by the die. The entry to the hole 45 is rounded, but the exit has a sharp edge 46. The edge 46 and its adjacent regions have been subjected to an ion implantation treatment such as those previously described, as have the surfaces of the end cap 44 of the punch 43.

If desired, the punch 43 can be fitted with a wear ring at its operative end made of a cemented carbide material rather than a complete end cap, in which case the ion implantation treatment is confined to the surfaces of the wear ring which are exposed in use.

Figure 5:
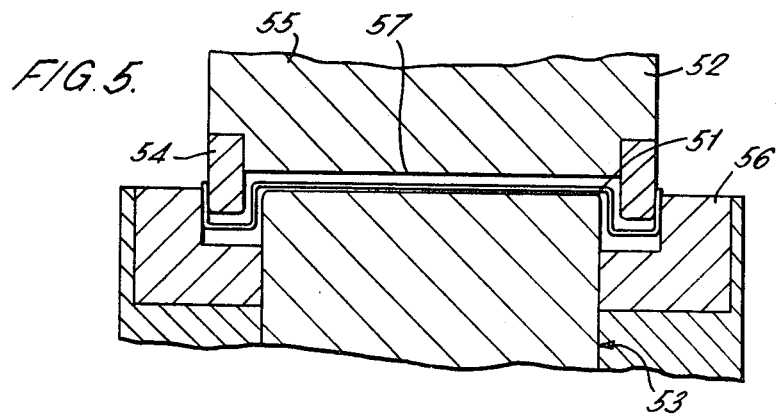
FIG. 5 is a diagrammatic cross-section of an apparatus embodying the invention for forming the ends of metal cans.

FIG. 5 shows an apparatus for producing end caps for metal cans in which a flat metal blank 51 is deformed between a punch 52 and an anvil 53. The punch 52 has a protruding peripheral porion 54 made of a cemented carbide material attached to the main body 55 of the punch 52. The anvil 53 has an annular grooved portion 56 also made of a cemented carbide material, which co-operates with the peripheral portion 54 of the punch 52, as shown. The working surfaces of the peripheral portion 54 of the punch 52 and the grooved portion 56 of the anvil 53 are subjected to an ion implantation treatment such as those previously described.

Suitable cemented carbide materials are tungsten carbide and that known as "Stellite".

Figure 6A:
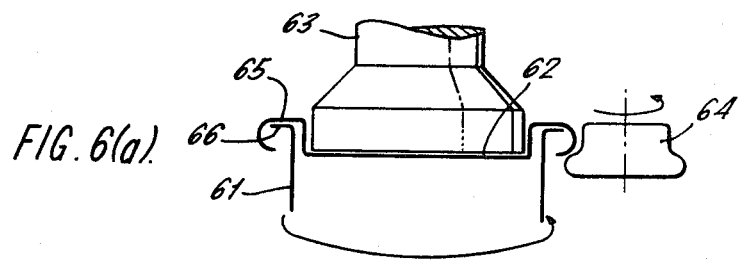
FIGS. 6(a) to 6(c) are diagrammatic representation of an apparatus embodying the invention for attaching an end of a metal can to the body of the can.
Figure 6B:
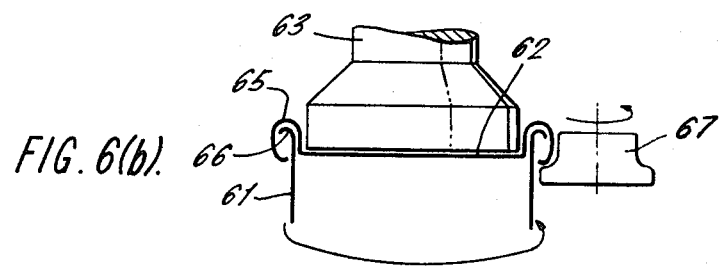
Figure 6C:
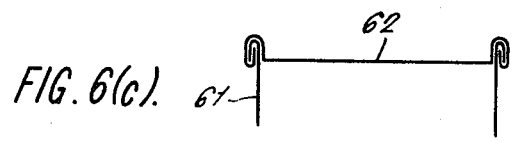

FIGS. 6(a) to 6(c) illustrate an apparatus for attaching end-caps to metal can bodies. The can body 61 is mounted on a turntable which is not shown and rotated as shown. The end cap 62 which has been previously placed in position on the can body 61 is held in place by a seaming chuck 63. A first seaming roll 64 deforms the outer portion 65 of the end cap 62 so that it curls under a flange 66 on the can body 61. A second seaming roll 67 then further deforms the outer portion of the end cap 62 and the flange 66 on the can body 61 to form a hermetic seal, as shown in FIG. 6(c).

The working surfaces of the seaming roll 64 and 67 are made of a cemented carbide material as can be the peripheral portion of the end of the seaming chuck 63. The working surfaces of the seaming rolls 64 and 67 are subjected to an ion implantation process such as those described, as are those of the seaming chuck 63 when they are made of a cement carbide material. The preferred cement carbide material in this case is that known as "Stellite".

We claim:

1. A method of treating a metal working tool element made of cemented carbide materials, as hereinbefore described, comprising the operation of implanting into a working surface of the tool element ions of a material such as to interact with the matrix metal of the tool element in such a way as substantially to prevent adhesion between the matrix metal of the cemented carbide tool element and a metal being worked by the tool element.

2. A method of treating metal working dies made of cemented tungsten carbide comprising the operation of implanting into a working surface of the dies ions of a material such as to interact with the matrix metal of the dies in such a way as substantially to prevent adhesion between the matrix metal of the cemented tungsten carbide and metal being formed by the die.

3. A method according to claim 2 wherein the implanted ions are selected from the group comprising $B^+$, $CO^+$, $O^+$, $Cl^+$, $Br^+$, $Be^+$, $A^+ N^+$ and $He^+$ ions.

4. A method according to claim 2 wherein the implanted ions are selected from the group comprising $Fe^+$, $Cu^+$, $Zn^+$, $Mo^+$, $Ag^+$, $Cd^+$, $In^+$, $Su^+$ and $Pb^+$.

5. A method according to claim 2 wherein the ions are selected from the group comprising $Li^+$, $Na^+$, $Mg^+$, $K^+$, $Ca^+$, $Ti^+$, $V^+$, $Mo^+$, $W^+$ and $Bi^+$.

6. A method according to claim 2 wherein the ions are implanted to a concentration of at least $1 \times 10^{17}$ ions/cm$^2$ in those regions of the tool element which are treated.

7. A method according to claim 5 wherein the ions are implanted to a concentration of $5 \times 10^{17}$ ions/cm$^2$.

8. A cemented carbide, as hereinbefore described, metal-working tool element having a working surface into which has been implanted ions of a material such as to interact with the matrix metal of the cemented carbide tool element in such a way as substantially to prevent adhesion between the matrix metal of the cemented carbide tool element and a metal being worked by the tool element.

9. A tool element according to claim 8 wherein the cemented carbide material is cemented tungsten carbide.

10. A tool element according to claim 8 wherein the cemented carbide material comprises tungsten and chromium carbides in a matrix of cobalt and chromium.

11. A tool element according to claim 8 comprising a metal working die.

12. A tool element according to claim 9 comprising a die for use in the drawing and wall ironing of metal can bodies.

13. A tool element according to claim 8 comprising a seaming roll for use in conjunction with a seaming chuck to form a double seam securing a metal can end to a can body.

14. A tool element according to claim 8 comprising a punch for use in conjunction with another tool element comprising a die to form end caps for metal cans.

15. A tool element according to claim 8 wherein the working surface is implanted with ions selected from the group comprising $B^+$, $N^+$, $O^+$, $Cl^+$, $He^+$, $CO^+$, $Br^+$, $A^+$ and $Be^+$ ions.

16. A tool element according to claim 8 wherein the working surface is implanted with ions selected from the group comprising $Fe^+$, $Cu^+$, $Zn^+$, $Mo^+$, $Ag^+$, $Cd^+$, $In^+$, $Sn^+$ and $Pb^+$ ions.

17. A tool element according to claim 8 wherein the working surface is implanted with ions selected from the group comprising $Li^+$, $Na^+$, $Mg^+$, $K^+$, $Ca^+$, $Ti^+$, $V^+$, $Mo^+$, $W^+$ and $Bi^+$ ions.

18. A tool element according to claim 8 wherein the working surface of the tool element is implanted with ions to a concentration of at least $1 \times 10^{17}$ ions/cm$^2$ in the treated regions of the tool element.

19. A tool element according to claim 16 wherein the concentration of ions is $5 \times 10^{17}$ ion/cm$^2$.

* * * * *